United States Patent

Matsumura

(10) Patent No.: US 6,832,680 B1
(45) Date of Patent: Dec. 21, 2004

(54) WORK CONVEYING SYSTEM AND TRAVELING PATH SEALING STRUCTURE IN THE WORK CONVEYING SYSTEM

(75) Inventor: Kazuyuki Matsumura, Tokyo (JP)

(73) Assignee: Hirata Corporation (JP)

( * ) Notice: Subject to any disclaimer, the term of this patent is extended or adjusted under 35 U.S.C. 154(b) by 0 days.

(21) Appl. No.: 10/676,108

(22) Filed: Oct. 2, 2003

Related U.S. Application Data

(62) Division of application No. 10/230,275, filed on Aug. 29, 2002, now Pat. No. 6,766,895.

(30) Foreign Application Priority Data

Sep. 3, 2001 (JP) .......................................... 2001-265177

(51) Int. Cl.[7] .............................................. B65G 45/00
(52) U.S. Cl. .......................... 198/495; 414/940; 384/15
(58) Field of Search ................................ 198/494, 495; 414/940; 384/15, 324, 634, 326

(56) References Cited

U.S. PATENT DOCUMENTS

| | | | | |
|---|---|---|---|---|
| 3,563,203 A | * | 2/1971 | Stiltner ........................ | 118/324 |
| 4,207,833 A | * | 6/1980 | Napadow ...................... | 118/324 |
| 4,376,543 A | * | 3/1983 | Sakagami ..................... | 277/345 |
| 4,892,416 A | * | 1/1990 | Hassler et al. ................. | 384/58 |
| 5,658,078 A | * | 8/1997 | Cawley .......................... | 384/7 |
| 6,547,320 B2 | * | 4/2003 | Kohout et al. .............. | 296/223 |
| 6,604,624 B2 | * | 8/2003 | Hirata et al. ................. | 198/494 |

* cited by examiner

*Primary Examiner*—Richard Ridley
(74) *Attorney, Agent, or Firm*—Lorusso, Loud & Kelly

(57) ABSTRACT

In a work conveying system including at least a work holder for holding a work and a horizontal mover for moving the work holder horizontally in an upper ceiling space within a clean room, the work being conveyed to each of plural processing apparatuses. The horizontal mover has at least one linear moving mechanism including a duct with an internal guide, a traveling body engaging the guide and traveling through the traveling path defined by the duct, and a slider connected to the traveling body for travel with the traveling body on the exterior of the traveling path. The work holder is attached to the slider. Air cleaners are disposed at suitable intervals in the traveling path to clean the air therein and to discharge the cleaned air to the exterior. The traveling path accommodates a drive source, a drive mechanism, and a power supply.

5 Claims, 14 Drawing Sheets

WORK CONVEYING SYSTEM AND TRAVELING PATH SEALING STRUCTURE IN THE WORK CONVEYING SYSTEM

CROSS-REFERENCE TO RELATED APPLICATION

This application claims, under 35 USC 119, priority of Japanese Application No. 2001-265177 filed Sep. 3, 2001 and is a division of application U.S. Ser. No. 10/230,275 filed Aug. 29, 2002, now U.S. Pat. No. 6,766,895.

BACKGROUND OF THE INVENTION

1. Field of the Invention

The present invention relates to a work conveying system and a traveling path sealing structure in the work conveying system. Particularly, the present invention is concerned with an improvement of a work conveying system and a traveling path sealing structure wherein, in a production line installed within a clean room for the production of, for example, semiconductor components, liquid crystal display panels, medical supplies, drugs, or processed foods, dust generated in the interior of a traveling path (guide rail) in the work conveying system is prevented from leaking out into the clean room, the work conveying system being adapted to convey a work to each of plural processing apparatuses while allowing the work to circulate among the processing apparatuses.

2. Description of the Prior Art

In a semiconductor integrated circuit or a liquid crystal display panel, the deposition of dust causes a lowering of product yield. As to medical supplies, drugs and processed foods, it is desirable for them to be produced in a sterile and sanitary environment. In this connection, intra-clean room production lines are in operation in a wide variety of fields including those production fields, and various technical developments have been made with respect to various processing chambers and work conveying systems installed within clean rooms.

As to the work conveying system, an overhead traveling type work conveying system has been developed. According to this work conveying system, a layout mode of various processing apparatuses to be installed within a clean room is difficult to be restricted and it is possible to select an optimum layout, that is, it is possible to utilize the interior of the clean room effectively and thereby possible to reduce the equipment cost and operation cost of the clean room. The adoption of such an optimal layout is advantageous also in that the work conveying system which can be a generation source of dust (particles) can be kept away from apparatuses such as various processing chambers installed within the clean room.

The applicant in the present case has previously invented a work conveying system provided with moving means capable of moving a work holding means in arbitrary three-dimensional directions in the upper ceiling space within the clean room and applied for a patent (see Japanese Patent Laid Open No. 2000-243808).

In this work conveying system, a pair of horizontal fixed guide rails are laid in parallel within a ceiling space and one or plural horizontal traveling guide rails are laid between the pair of fixed guide rails so that they can travel along the fixed guide rails. On each traveling guide rail is provided a traveling block which can travel along the traveling guide rail. A horizontal moving means is constituted by the fixed guide rails, traveling guide rail(s), and a traveling block. Further, the traveling block is provided with a vertical moving means which can move the work holding means up and down. A three-dimensional moving means is constituted by the horizontal moving means and the vertical moving means.

The fixed and traveling guide rails, which are each in an elongated duct shape, contain a drive portion (including a drive motor and a drive mechanism) for the traveling guide rail and the traveling block, also contain a power supply means, and are communicated with each other. Dust (particles) generated from the drive portion and various slide portions is confined into ducts which constitute the fixed and traveling guide rails and is sucked in from one end of a communication path and is discharged to the exterior of the clean room. In this way contamination in the clean room caused by dust present within the ducts which constitute the guide rails is prevented to a considerable extent.

However, the communication path which provides communication between the fixed guide rails and the traveling guide rail(s) is long and, while the dust present within the ducts as communication constituents of the guide rails is sucked in from one end of the communication path and is discharged to the exterior of the clean room, there is a fear that the dust may leak to a lower portion of the clean room from a gap in the communication path, especially from an elongated gap in which a connecting member for connection between the traveling guide rail(s) and the drive portion thereof extends through the duct as a constituent of a fixed guide rail or from an elongated gap in which a connecting member for connection between the traveling block and the drive portion thereof extends through the duct as a constituent of the traveling guide rail, with a consequent likelihood of lowering in the degree of cleanness of the clean room.

In FIG. 17 there is illustrated a sealing structure in this work conveying system, in which an elongated gap 028 formed in a portion where a connecting member 022 for connection between a traveling guide rail 015 and a drive portion thereof (including a drive motor 023 and a drive roller 026) extends through a duct 017 as a constituent of a fixed guide rail 014 is sealed. In this sealing structure, the connecting member 022 has a zigzag-bent sectional shape and shield plates 041*a* and 041*b* are inserted deep into slit portions (slits 022*a* and 022*b*) of the connecting member 022, thereby constituting a labyrinth to prevent dust generated in the drive and slide portions in the duct from leaking out into the clean room. However, even with such a labyrinth structure, since the suction of dust is performed through a long communication path, it has so far been impossible to completely prevent the dust present in the duct from leaking out to the lower portion of the clean room.

Other examples of overhead traveling type work conveying systems are disclosed in Japanese Patent Laid Open Nos. 1993-116885, 1993-39030, and 1995-291123. In these work conveying systems, a traveling roller provided in a traveling body is adapted to roll on a rail laid on a ceiling, whereby the traveling body travels. But a drive portion to drive the traveling roller is covered with a cover member attached to the traveling body itself, so that dust generated in the drive portion and a slide portion between the traveling roller and the rail is easy to be released into the clean room. Since the above conventional techniques are not dedicated to a clean room, they are not applicable to a satisfactory extent to a clean room for which a high degree of cleanness is required.

SUMMARY OF THE INVENTION

It is an object of the present invention to solve the above-mentioned problems involved in the conventional overhead traveling type work conveying system and provide a work conveying system and a traveling path sealing structure in the work conveying system which can prevent dust generated from a drive portion(s) and various slide portions in a traveling path of the work conveying system from leaking out into a clean room, the work conveying system comprising fixed guide rails and a traveling guide rail(s), and thereby prevent a lowering in the degree of cleanness of the clean room more effectively.

For achieving the above-mentioned object, in a first aspect of the present invention there is provided a work conveying system comprising a least a work holding means for holding a work and a horizontal moving means for moving the work holding means horizontally in an upper ceiling space within a clean room, the work being conveyed to each of plural processing apparatuses while circulating among the processing apparatuses, wherein the horizontal moving means has at least one linear moving mechanism, the linear moving mechanism comprising a traveling path covered with a duct and having a guide portion in the interior thereof, a traveling body adapted to engage the guide portion and travel through an interior space of the traveling path, and a slider connected to the traveling body and adapted to travel together with the traveling body in the exterior of the traveling path, the work holding means or another linear moving mechanism being attached to the slider, and cleaning means are disposed at suitable intervals in the traveling path to clean the air present within the traveling path and discharge the cleaned air to the exterior.

Since the invention in the first aspect is constructed as above, there can be obtained the following effects.

Since the traveling body, which is one constituent of the linear moving mechanism provided in the horizontal moving means, is adapted to engage the guide portion located within the traveling path covered with a duct and travel through the interior space of the traveling path, dust generated from a slide portion in which the traveling body and the guide portion are engaged with each other is confined into the duct and the possibility of its leaking out into the exterior clean room is decreased. Besides, since cleaning means for cleaning air present within the traveling path and discharging it to the exterior are disposed at suitable intervals in the traveling path, dust present in the traveling path is sucked and cleaned in the unit of a relatively short traveling path and the cleaned air is discharged to the exterior. Thus, it is possible to greatly decrease the proportion of dust leaking out into the clean room. Consequently, it becomes possible to keep high the degree of cleanness in the clean room.

In a second aspect of the present invention there is provided, in combination with the above first aspect, a work conveying system wherein a drive source, a drive mechanism, and a power supply means, which are for the traveling body, are accommodated in the interior of the traveling path, at least the drive source being integral with the traveling body.

According to this construction, the drive portion (including the drive source and the drive mechanism) is also positioned in the interior of the traveling path, whereby the possibility that the dust generated from the drive portion may leak out into the clean room located outside the duct is decreased. As a result, it becomes possible to keep higher the degree of cleanness in the clean room.

In a third aspect of the present invention there is provided, in combination with the above first or second aspect, a work conveying system wherein a base member serving as a base of a guide member having the guide portion constitutes a part of the duct, the guide member and the base member being formed by integral molding of the same material.

According to this construction, the guide member and the base member which constitutes a part of the duct can be fabricated at a low cost by drawing aluminum for example.

Further, in a fourth aspect of the present invention there is provided, in combination with any of the above first to third aspects, a work conveying system wherein in the horizontal moving means a plurality of the linear moving mechanisms are used in combination to permit the horizontal moving means to move arbitrarily in a horizontal plane in the upper ceiling space within the clean room.

According to this construction, the work conveying system can be constructed such that in the upper ceiling space within the clean room, fixed guide rails each provided with an individual linear moving mechanism are disposed horizontally in parallel on both sides, a traveling guide rail provided with an individual linear moving mechanism is laid between the fixed guide rails so that it can travel along both fixed guide rails, and a traveling block adapted to travel while holding the work is attached to the linear moving mechanism provided in the traveling guide rail so that the traveling block can travel along the traveling guide rail. Thus, a horizontal moving means capable of moving arbitrarily in a horizontal plane in the ceiling space can be constructed in a simple manner.

In a fifth aspect of the present invention there is provided, in combination with any of the above first to fourth aspects, a work conveying system wherein the work holding means is attached to the slider through a vertical moving means for moving the work holding means vertically.

According to this construction, a work conveying system provided with a three-dimensional moving means which permits arbitrary movement of the work holding means in a space within the clean room can be constructed in an extremely simple manner.

In a sixth aspect of the present invention there is provided a work conveying system comprising at least a work holding means for holding a work and a horizontal moving means for moving the work holding means horizontally in an upper ceiling space within a clean room, the work being conveyed to each of plural processing apparatuses while circulating among the processing apparatuses, wherein the horizontal moving means has at least one linear moving mechanism, the linear moving mechanism comprising a traveling path covered with a duct and having a guide portion in the interior thereof, a traveling body adapted to engage the guide portion and travel through an interior space of the traveling path, and a slider connected to the traveling body and adapted to travel together with the traveling body in the exterior of the traveling path, the work holding means or another linear moving mechanism being attached to the slider, and a deformable sealing means is provided in an elongated gap portion in which a connecting member for connecting the slider to the traveling body extends through the duct and travels along the traveling path, the sealing means covering the elongated gap portion without obstructing the travel of the connecting member.

In the sixth aspect constructed as above there can be obtained the following effects.

Since the traveling body as one constituent of the linear moving mechanism provided in the horizontal moving means of the work conveying system is adapted to engage the guide portion located within the traveling path covered with the duct and travel through the interior space of the traveling path, dust generated from a slide portion in which the traveling body and the guide portion are engaged with each other is confined into the duct and the possibility of its leaking out into the exterior clean room is decreased. Besides, since a deformable sealing means is provided in an elongated gap portion in which the connecting member for connecting the slider to the traveling body extends through the duct which covers the traveling path, the sealing means covering the elongated gap portion without obstructing the travel of the connecting member, the proportion of dust leaking out from the elongated gap portion into the clean room can be greatly decreased. Consequently, it becomes possible to keep high the degree of cleanness in the clean room.

Further, in a seventh aspect of the present invention there is provided a traveling path sealing structure in a work conveying system, the work conveying system including at least one linear moving mechanism, the linear moving mechanism comprising a traveling path covered with a duct and having a guide portion in the interior thereof, a traveling body adapted to engage the guide portion and travel through an interior space of the traveling path, and a slider connected to the traveling body and adapted to travel together with the traveling body in the exterior of the traveling path, the working holding means or another linear moving mechanism being attached to the slider, wherein a deformable sealing means is provided in an elongated gap portion in which a connecting member for connecting the slider to the traveling body extends through the duct and travels along the traveling path, the sealing means covering the elongated gap portion without obstructing the travel of the connecting member.

According to this construction there can be obtained the following effects.

Since the traveling body as one constituent of the linear moving mechanism provided in the work conveying system is adapted to engage the guide portion located in the interior of the traveling path covered with the duct and travel through the interior space of the traveling path, dust generated from a slide portion where the traveling body and the guide portion engage each other is confined into the duct and the possibility of its leaking out into the exterior clean room is decreased. Besides, since a deformable sealing member is provided in an elongated gap portion in which the connecting member for connecting the slider to the traveling body extends through the duct which covers the traveling path, the sealing means covering the elongated gap portion without obstructing the travel of the connecting member, it is possible to greatly decrease the proportion of dust leaking out to the exterior from the elongated gap portion. Consequently, the degree of cleanness of the external environment can be kept high.

In an eighth aspect of the present invention there is provided, in combination with the above seventh aspect, a traveling path sealing structure in a work conveying system wherein the sealing means is an expansion member in the shape of bellows which normally extends naturally to seal the elongated gap portion.

According to this construction, by merely providing in the elongated gap portion a bellows-like expansion member which is commonly used as a sealing member or a protective cover member, there can be easily obtained a deformable sealing means which covers the elongated gap portion without obstructing the travel of the connecting member.

In a ninth aspect of the present invention there is provided, in combination with the above seventh aspect, a traveling path sealing structure in a work conveying system wherein the sealing member is an expansion member which normally extends by virtue of magnetism to seal the elongated gap portion.

According to this construction, by magnetizing a lower edge of a commonly-used expansion member which lower edge extends along the elongated gap and by attracting the lower edge magnetically, the expansion member is extended to cover the elongated gap portion. Consequently, in a portion where the connecting member does not pass, the sealing of the elongated gap portion is ensured, with no obstruction to a smooth travel of the connecting member.

Further, in a tenth aspect of the present invention there is provided, in combination with the above eighth or ninth aspect, a traveling path sealing structure in a work conveying system wherein when looking in the traveling direction of the connecting member, in front of the connecting member are provided a first seal holding member for holding the sealing means in an initially closed state and a first seal opening member for subsequently opening the sealing member while the connecting member travels through the elongated gap portion, and at the rear of the connecting member are provided a second seal opening member for holding the sealing means in an initially opened state and a second seal holding member for subsequently closing the sealing member while the connecting member travels through the elongated gap portion.

According to this construction, closure of the elongated gap portion by the sealing means in a portion where the connecting member does not pass and release (opening) of the closure of the elongated gap portion by the sealing means in a portion where the connecting member passes are performed forcibly, so that both positive sealing of the elongated gap portion and smooth travel of the connecting member can be effected simultaneously.

In an eleventh aspect of the present invention there is provided, in combination with the above seventh aspect, a traveling path sealing structure in a work conveying system wherein the sealing means is constituted by a chain and normally hangs down naturally to seal the elongated gap portion.

According to this construction, by merely providing a chain as a commonly-used part in the elongated gap portion, it is possible to easily obtain a deformable sealing means which covers the elongated gap portion without obstructing the travel of the connecting member.

In a twelfth aspect of the present invention there is provided, in combination with the above seventh aspect, a traveling path sealing structure in a work conveying system wherein the sealing means comprises a pair of upper and lower elastic tubular members which press the connecting member constantly from above and below, and when the connecting member travels through the elongated gap portion, the connecting member travels while pushing aside the pair of upper and lower elastic tubular members vertically, while after passage of the connecting member, the pair of upper and lower elastic tubular members can immediately revert to their original shape.

According to this construction, by only providing the elongated gap portion with a pair of upper and lower elastic tubular members as commonly-used components, e.g., elastic tubular members (tubes or the like) having a bellows shape or a balloon shape in section, there can be easily obtained a deformable sealing means which covers the elongated gap portion without obstructing the travel of the connecting member.

DETAILED DESCRIPTION OF PREFERRED EMBODIMENTS

An embodiment (first embodiment) of the invention described in the foregoing first to fifth aspects will be described below with reference to FIGS. 1 to 3.

Figure 1:
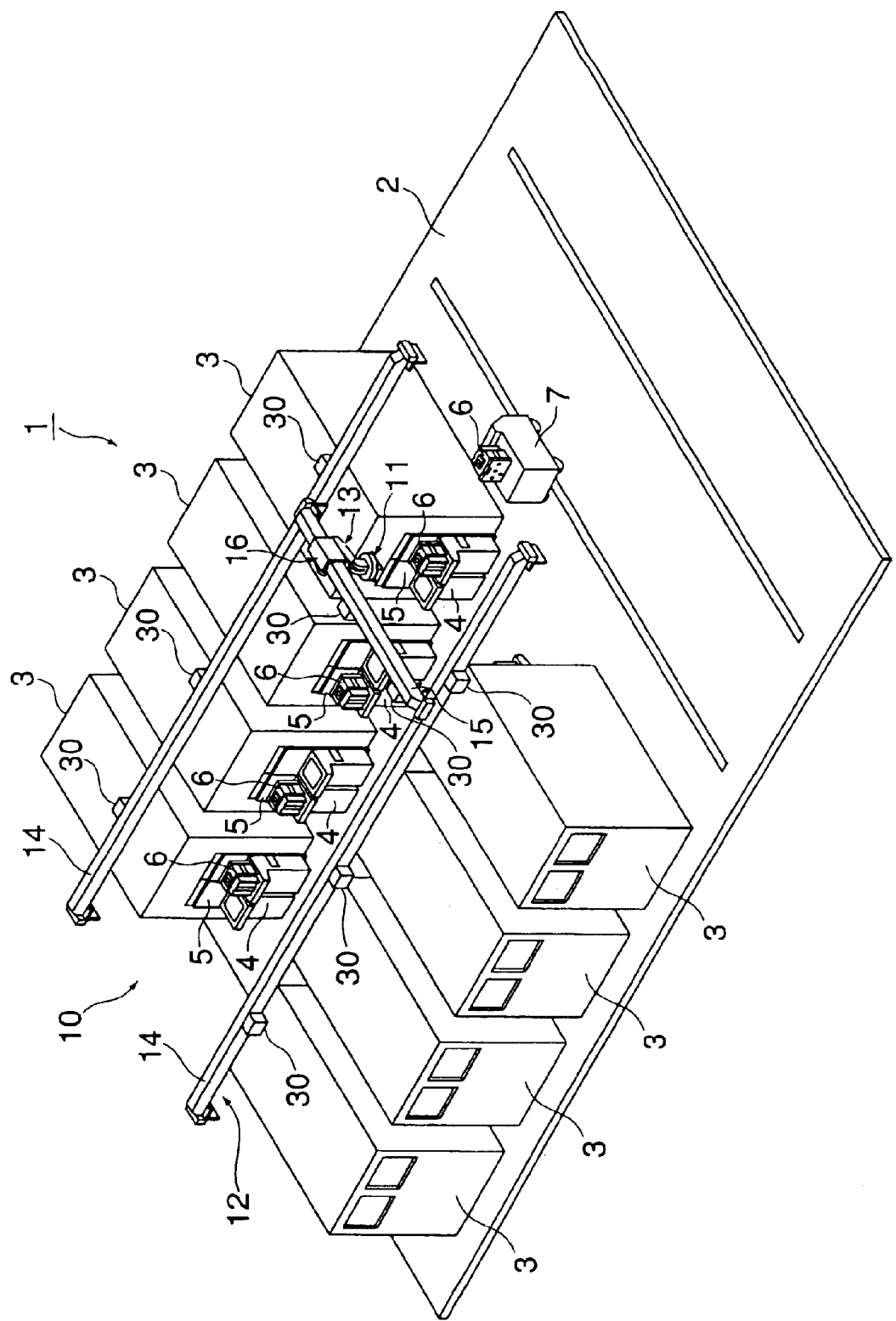
FIG. 1 is a perspective view of a production line in a clean room to which is applied a work conveying system according to an embodiment (first embodiment) of the invention described in the foregoing first to fifth aspects.
Figure 2:
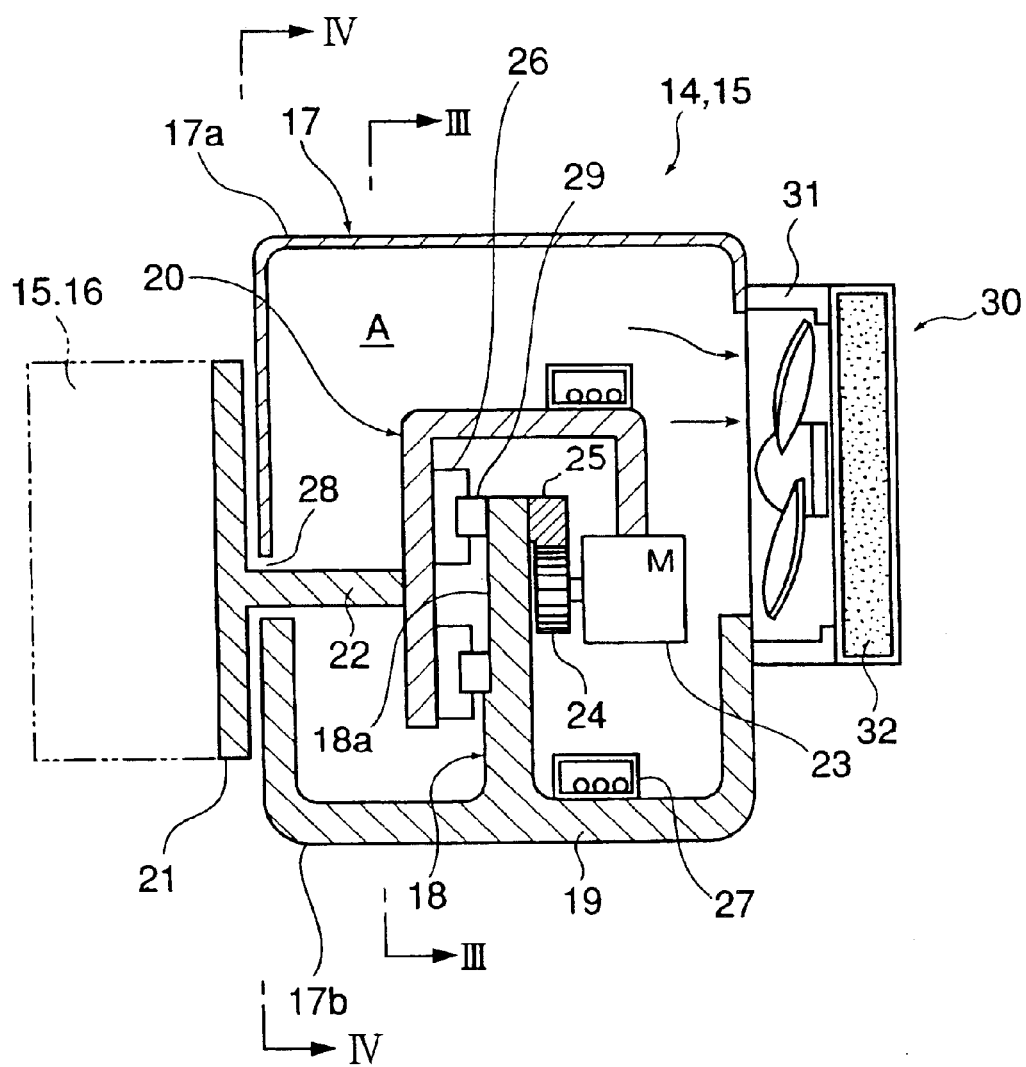
FIG. 2 is a cross sectional view of a linear moving mechanism provided in a horizontal moving means used in the work conveying system, with a cross sectional view of a cleaning means overlapped thereon.
Figure 3:
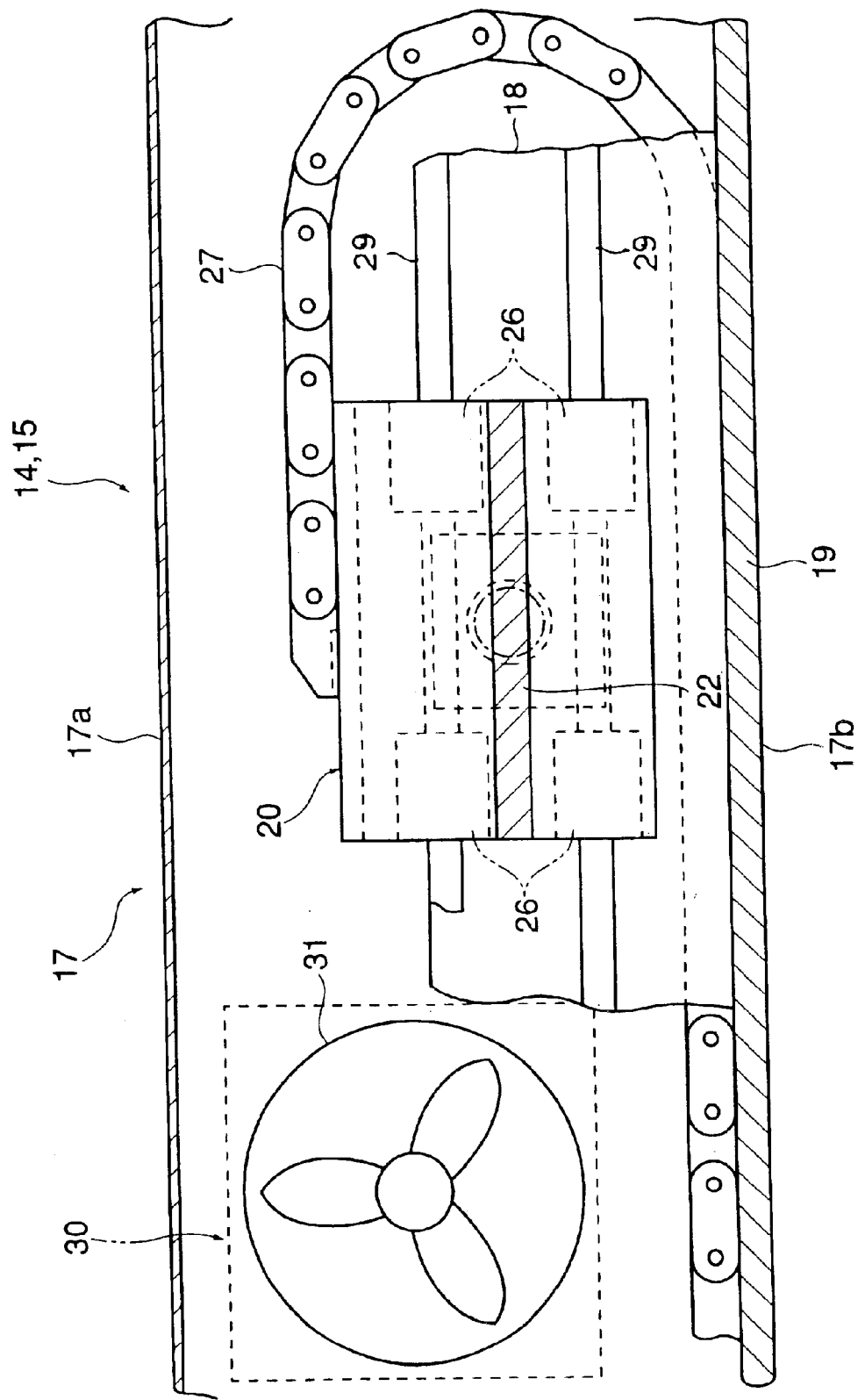
FIG. 3 is a sectional view as seen in the direction of arrows III—III in FIG. 2.

FIG. 1 is a perspective view of a production line in a clean room to which a work conveying system of the first embodiment is applied, FIG. 2 is a cross sectional view of a linear moving mechanism provided in a horizontal moving means used in the work conveying system, with a cross sectional view of a cleaning means overlapped thereon, and FIG. 3 is a sectional view as seen in the arrowed direction III—III in FIG. 2.

In a production line 1 installed within a clean room to which the work conveying system of the first embodiment is applied, as shown in FIG. 1, plural processing chambers (processing apparatuses) 3 are arranged side by side in two rows on a floor surface 2 in the clean room, and an interface device 4 being attached to a front end of each processing chamber 3.

The processing chambers 3 are apparatuses for conducting different processings for works one after another. Taking tact time balance in work processing into account, a plurality of same processing chambers may be included in the production line. For example, the processing chambers 3 are semiconductor wafer processing apparatuses for subjecting a semiconductor wafer to such processings as the application of resist, exposure, development, ion implantation, annealing, and sputtering. With such processings for a semiconductor wafer in mind, the following description is now provided. The interface device 4 associated with each semiconductor wafer processing apparatus is constituted by a device called FOUP opener.

The interface devices 4 constitute buffer spaces for isolating the processing chambers 3 and the clean room from each other. The delivery of works in each processing chamber 3 is performed through the associated interface device 4. A work inlet/outlet 5 in each interface device 4 is hermetically sealed except when loading and unloading a work.

Adjacent processing chambers 3 and interface devices 4 are arranged through a minimum maintenance area required for works which maintenance personnel or operator personnel performs. Thus, the floor area of the clean room is minimized to make the most of the clean room and attain an efficient conveyance of works by the work conveying system 10 to be described later. But it is not always necessary that the processing chambers 3 be arranged in plural rows, nor is specified in which direction a front side (the side where each interface device 4 is provided) should face. A certain degree of random arrangement is allowed.

In an upper space within the clean room is installed the work conveying system 10 for conveying a hermetically sealed container (FOUP) 6 to the processing chambers 3. Works are conveyed in a hermetically sealed state within the hermetically sealed container 6 in order to keep a high degree of cleanness required. On the floor surface 2 is provided a space for the travel of work carriers 7. When a work carrier 7 receives the hermetically sealed container 6 which has been conveyed from outside the clean room, the work carrier 7 travels up to a predetermined position along a rail which is laid there, and delivers the container 6 to the work conveying system 10.

The work conveying system 10 is provided with work holding means 11 for holding the hermetically sealed container 6, horizontal moving means 12 for moving the work holding means 11 horizontally in an upper ceiling space within the clean room, and vertical moving means 13 constituted by an articulated arm and provided in the horizontal moving means 12. As noted earlier, the work conveying system 10 conveys works (the hermetically sealed container 6) to each processing chamber 3 while circulating among plural processing chambers in a predetermined processing sequence. In the vertical moving means 13, the articulated arm is extended and contracted to raise and lower the work holding means 11, thereby making it possible to delivery works between the work holding means 11 and each of the processing chambers 3. A three-dimensional moving mechanism is constituted by both horizontal moving means 12 and vertical moving means 13.

As shown in FIG. 1, the horizontal moving means 12 comprises a pair of horizontal fixed guide rails 14 which are laid in parallel in the upper ceiling space within the clean room, a traveling guide rail 15 laid between the pair of fixed guide rails 14, and a traveling block 16 disposed on the traveling guide rail 15 and adapted to travel along the traveling guide rail 15. The traveling guide rail 15 travels along the pair of fixed guide rails 14 and traveling block 16 travels along the traveling guide rail 15, whereby in the upper ceiling space within the clean room the horizontal moving means 12 can move arbitrarily in a horizontal plane sandwiched in between the pair of fixed guide rails 14. Consequently, the vertical moving means 13 and the work holding means 11 can be moved linearly from a certain position to another position located on the opposite side with a central passage therebetween sandwiched. Actually, the vertical moving means 13 is provided in the horizontal moving means 12 by being attached to the traveling block 16. A suitable spacing between the pair of horizontal fixed guide rails 14 is set according to how the processing chambers 3 are arranged (installed position and direction). The said spacing may be taken over the full width of the clean room.

Next, a detailed description will be given below about the structure of a linear moving mechanism provided in the horizontal moving means 12 for moving the traveling guide rail 15 along each of the pair of fixed guide rails 14 or a linear moving mechanism for moving the traveling block 16 along the traveling guide rail 15. Since both linear moving mechanisms are of a structure common to each other, a detailed description will be given below about the structure of only the linear moving mechanism for moving the traveling guide rail 15 along each of the pair of fixed guide rails 14.

In the linear moving mechanism for moving the traveling guide rail 15 along each of the pair of fixed guide rails 14, as shown in FIGS. 2 and 3, a traveling body 20 engages a guide portion 18a provided nearly centrally in the interior (traveling path A) of a duct 17 which constitutes an outer shell of each of the fixed guide rails 14, and travels along the guide portion 18a. Further, a slider 21 is connected to the traveling body 20 through a connecting member 22 and the traveling guide rail 15 is mounted to the slider 21. As the traveling body 20 travels along the guide portion 18a, the traveling guide rail 15 travels along the pair of fixed guide rails 14 outside the traveling path A together with the traveling body 20 through the connecting member 22 and the slider 21. In the linear moving mechanism for causing the traveling block 16 to travel along the traveling guide rail 15, the traveling block 16 is mounted to the slider 21. For diminishing stress imposed on the connecting member 22, the guide portion 18a may be positioned close to an elongated gap 28 to be described later.

The duct 17 is constituted by an integral connection of an upper duct half 17a and a base member 19 of a lower duct half 17b. In the interior of the duct 17 is defined the traveling path A of the traveling body 20 which determines a track of the traveling guide rail 15.

The lower duct half 17b is relatively thick-walled and is formed in a chevron-like sectional shape as a whole in which a guide member 18 having the guide portion 18a is erected on the base member 19 at a transversely central position. The guide portion 18a corresponds to a substantially upper half portion of the guide member 18, whereby the travel of the traveling body 20 is guided through linear bushings 26 and linear guide rails 29 which will be described later. The base member 19 constitutes a base of the guide member 18. Actually, the lower duct half 17b is integrally formed by drawing of aluminum for example.

The upper duct half 17a is relatively thin-walled and covers the lower duct half 17b from above. Both upper and lower duct halves cover the traveling path A while forming a substantially hermetically sealed duct 17. The upper duct half 17a is formed by a thin metallic or synthetic resin plate and is attached to the lower duct half 17b removably to facilitate maintenance.

In the interior of the traveling path A are accommodated a motor 23 as a drive source for driving the traveling body 20, a drive mechanism for the traveling body, and a movable cable 27 as a power supply means, of which the motor 23 is integral with the traveling body 20.

As shown in FIGS. 2 and 3, the traveling body 20 is constituted by a relatively thick-walled, rigid member having a J-shaped section. Linear bushings 26 are fixed at a total of four upper, lower and right, left positions to an inner surface of a long leg-side wall of the J-shaped section. The motor 23 is fixed to a lower end of a short leg-side wall of the J-shaped section and a pinion 24 is connected to an output shaft of the motor 23. A rack 25 is in mesh with the pinion 24, the rack 25 being fixed to the wall of the guide portion 18a on the side opposite to the side where a pair of linear guide rails 29 are fixed. The linear bushings 26 and the linear guide rails 29 are engaged with each other. Therefore, when the motor 23 operates, the pinion 24 and the rack 25 mesh with each other and the traveling body 20 moves linearly along linear tracks of the linear guide rails 29 relative to the guide portion 18a. The pinion 24 and the rack 25 constitute a drive mechanism for the traveling body 20, and the motor 23, pinion 24 and rack 25 as a whole constitute a drive portion for the traveling body 20.

One side edge of the connecting member 22, which is constituted by a relatively thick-walled, rigid plate member, is fixed to an outer surface (the side opposite to the side where the linear bushings 26 are installed) of the long leg-side wall of the J section of the traveling body 20 in the longitudinal direction of the traveling body 20. The opposite side edge of the connecting member 22 extends up to the outside of the duct 17 through the elongated gap 28 formed on one side of the duct and the slider 21 is integrally connected and fixed to the opposite side edge of the connecting member. As noted earlier, the traveling guide rail 15 or the traveling block 16 is mounted to the slider 21. On one side of the duct 17, mating surfaces of the upper duct half 17a and the lower duct half 17b are opposed to each other through a spacing which permits the connecting member 22 to pass therethrough, whereby the elongated gap 28 is defined.

One end of the movable cable 27 serving as a power supply means is fixed to the bottom of the duct 17, while the opposite end thereof is fixed to an outer surface of an upper wall of the traveling body 20, and at an intermediate portion between the one and opposite ends the movable cable 27 is bent in U shape. As the traveling body 20 travels, the movable cable 27 advances and retreats its bent position to supply the motor 23 with electric power fed from the interior of the factory concerned. Though not shown in detail, this electric power is branched halfway from the movable cable 27 and is conducted to the exterior of the duct 17 along the connecting member 22 and fed to the drive motor in the linear moving mechanism provided in the traveling guide rail 15 mounted to the slider 21 and to the drive motor in the vertical moving means suspended from the traveling block 16. Electric power may be collected through a current collector means from a power transmission line laid beforehand into the traveling path A instead of the movable cable 27.

As shown in FIG. 2, the drive portion of the traveling body 20 and a slide portion in which the traveling body 20 rubs against the guide portion 18a, etc. as it travels, are confined to a nearly central area of the duct 17 which is surrounded substantially by the traveling body 20 and a casing of the motor 23. Thus, the drive portion and the slide portion are spaced a distance through a wall from the elongated gap 28, so that dust generated in these portions is difficult to leak out into the clean room through the elongated gap 28.

On the opposite side of the duct 17 which defines the traveling path A there are disposed cleaning means 30, as shown in FIG. 2. The cleaning means 30, which are each made up of a fan 31 and a filter 32, are arranged at suitable intervals in the longitudinal direction of the duct 17 according to the length of the duct and according to the capacity of the fan 31. The cleaning means 30 clean dust (particles)-containing air present within the traveling path A between adjacent cleaning means 30 and discharge the cleaned air into the exterior clean room, whereby the cleanness in the clean room is maintained at a high degree.

The horizontal moving means 12, for which three sets of the above linear moving mechanisms are used in combination, is constituted as a two-dimensional moving mechanism comprising the pair of horizontal fixed guide rails 14, the traveling guide rail 15 laid between the pair of fixed guide rails 14, and the traveling block 16 disposed on the traveling guide rail 15 and adapted to travel along the traveling guide rail 15. This two-dimensional moving mechanism is movable arbitrarily in a horizontal plane in the upper ceiling space within the clean room. The number of the linear moving mechanisms to be combined is determined as necessary. For example, if another traveling guide rail 15 is laid between the pair of fixed guide rails 14 and another traveling block 16 is mounted on the traveling guide rail 15, another three sets of linear moving mechanisms are used in combination.

Since this first embodiment is constructed as above, there can be attained the following effects.

Since the traveling body 20 as one constituent of each linear moving mechanism provided in the horizontal moving means 12 is adapted to engage the guide portion 18a located within the traveling path A covered with the duct 17 and travel through the interior space of the traveling path A, dust generated from the slide portion in which the traveling body 20 and the guide portion 18a are engaged with each other is confined into the duct 17 and the possibility of its leaking out into the exterior clean room is diminished. Besides, since the motor 23 serving as a drive source of the traveling body 20 is integral with the traveling body 20, the drive portion (including the drive motor 23, pinion 24 and rack 25) of the traveling body 20 is also positioned in the interior of the traveling path A and hence the possibility that dust generated from the drive portion may leak out into the clean room is also diminished. In the traveling path A, moreover, since cleaning means 30 for cleaning air present in the interior of the traveling path A and discharging cleaned air to the exterior are disposed at suitable intervals, dust present in the traveling path A is sucked and cleaned in the unit of a relatively short traveling path length and is discharged into the exterior clean room, whereby the proportion of dust leaking out into the clean room can be greatly diminished. Consequently, it becomes possible to maintain the cleanness in the clean room at a high degree.

Additionally, since the slide portion between the traveling body 20 and the guide portion 18a and the drive portion of the traveling body 20 are positioned nearly centrally, or in the vicinity thereof, in the interior of the traveling path A covered with the duct 17, that is, since the drive portion and the slide portion are positioned relatively far from the elongated gap 28 portion in which the connecting member 22 for connecting the slider 21 to the traveling body 20 passes through the duct 17 which covers the traveling path A, the possibility that the dust generated from those drive portion and slide portions may be discharged into the clean room through the elongated gap 28 portion is so much decreased. Consequently, the interior of the clean room can be kept at a still higher degree of cleanness.

The base member 19 serving as a base of the guide member 18 having the guide portion 18a constitutes a part (a lower half) of the duct 17 and an integral body (the lower duct half 17b) of both guide member 18 and base member 19 is formed integrally by drawing the same aluminum material and therefore can be fabricated at a low cost.

In the horizontal moving means 12, moreover, plural sets of linear moving mechanisms are used in combination to permit arbitrary movement of the horizontal moving means in a horizontal plane in the upper ceiling space within the clean room. Therefore, in the upper ceiling space within the clean room, for example if fixed guide rails 14 each provided with an individual linear moving mechanism are disposed horizontally in parallel on both sides, if a traveling guide rail 15 provided with an individual linear moving mechanism is laid between the fixed guide rails 14 so that it can travel along both fixed guide rails 14, and if a traveling block 16 adapted to hold works and travel is mounted to the linear moving mechanism provided in the traveling guide rail 15 so that it can travel along the traveling guide rail 15, there can be easily constituted the horizontal moving means 12 which can move arbitrarily in a horizontal plane in the ceiling space.

Further, since the work holding means 11 is mounted to the traveling block 16 through the vertical moving means 13 which is for moving the work holding means 11 up and down and since the traveling block 16 is mounted to the slider 21, the work conveying system 10 provided with a three-dimensional moving means which permits arbitrary movement of the work holding means 11 in a space within the clean room can be constituted in an extremely simple manner.

Next, the following description is now provided about an embodiment (second embodiment) of the invention described in the foregoing sixth to eighth and tenth aspects, which is illustrated in FIGS. 4 to 8.

Figure 4:
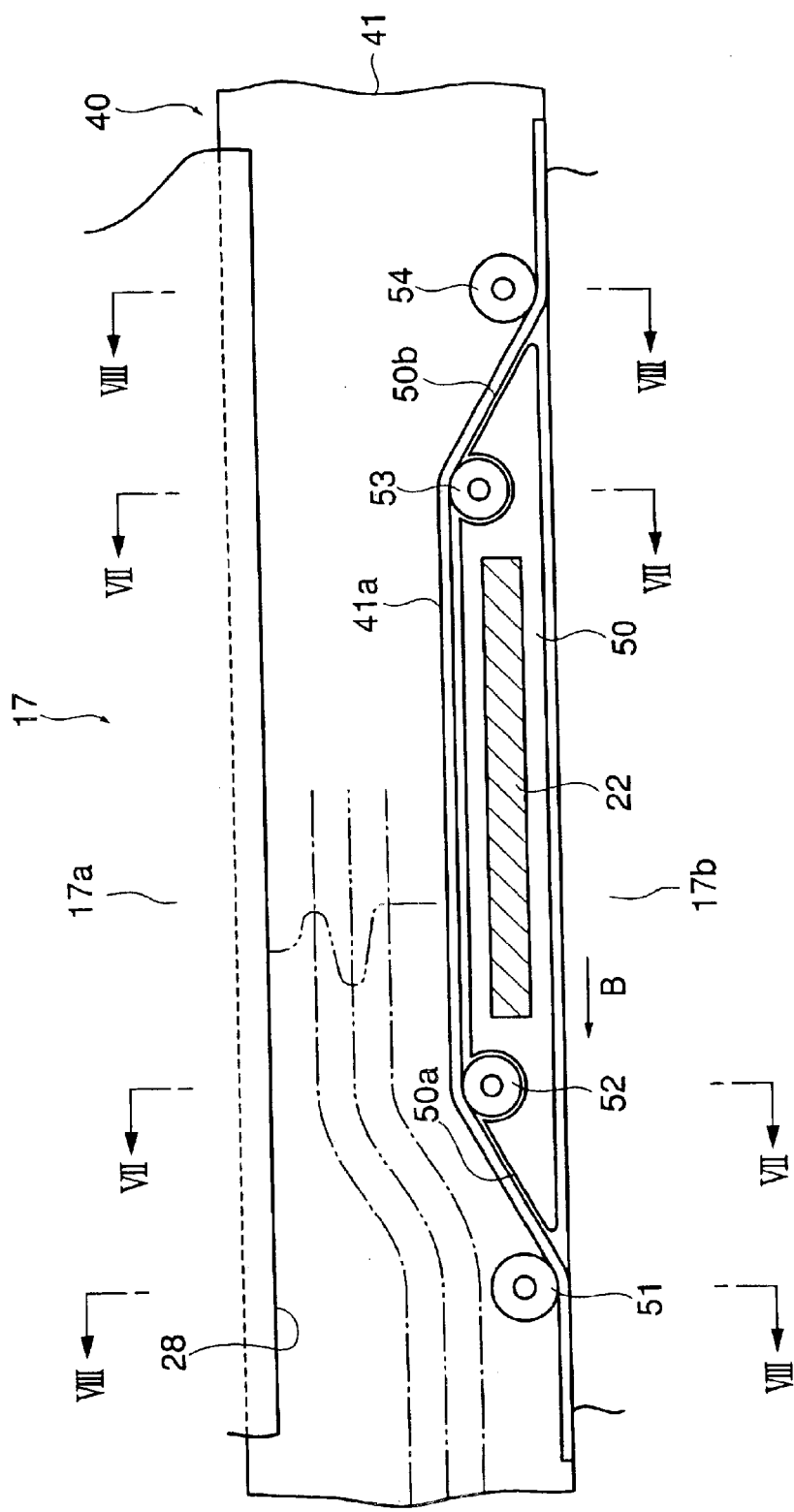
FIG. 4 is a partial sectional side view of a linear moving mechanism provided in a work conveying system according to an embodiment (second embodiment) of the invention described in the foregoing sixth to eighth aspects and tenth aspect, or provided in a horizontal moving means used in the work conveying system, as cut at a position corresponding to line IV—IV in FIG. 2 and as seen in the arrowed direction.
Figure 5:
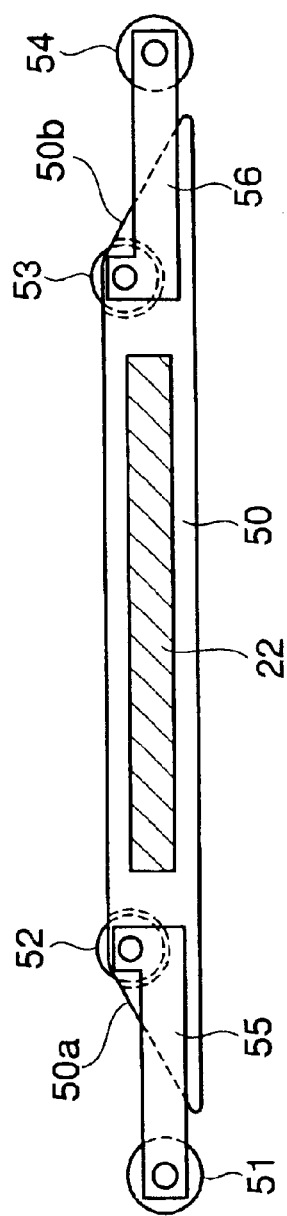
FIG. 5 is a sectional side view of only a connecting member portion as taken out and seen from FIG. 4, and is a sectional view as seen in the arrowed direction V—V in FIG. 6.
Figure 6:
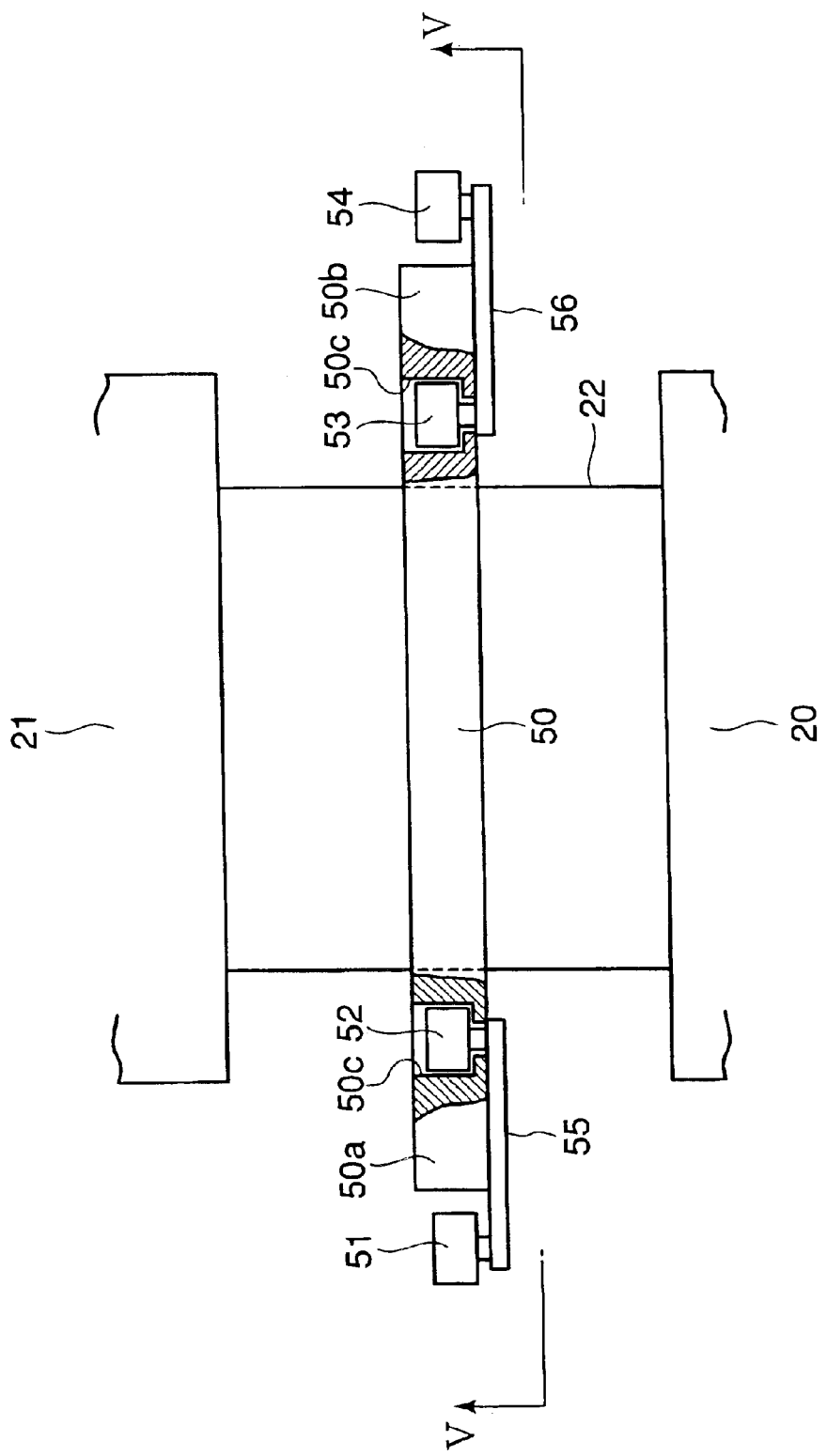
FIG. 6 is a plan view of FIG. 5, partially broken away.
Figure 7:
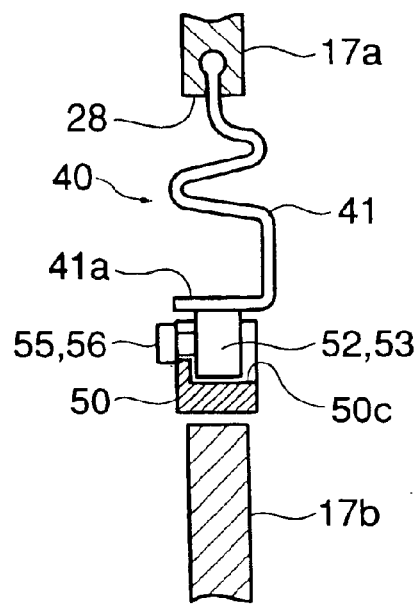
FIG. 7 is a sectional view as seen in the arrowed direction VII—VII in FIG. 4.
Figure 8:
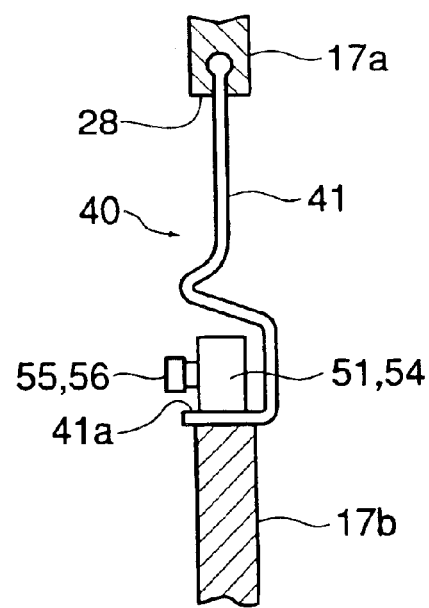
FIG. 8 is a sectional view as seen in the arrowed direction VIII—VIII in FIG. 4.

FIG. 4 is a partial sectional side view of a linear moving mechanism provided in a work conveying system of this second embodiment or in a horizontal moving means used therein, as cut at a position corresponding to line IV—IV in FIG. 2 and as seen in the arrowed direction, FIG. 5 is a sectional side view of only a connecting member portion as taken out and seen from FIG. 4, and is a sectional view as seen in the arrowed direction V—V in FIG. 6, FIG. 6 is a partially broken-away plane view of FIG. 5, FIG. 7 is a sectional view as seen in the arrowed direction VII—VII in FIG. 4, and FIG. 8 is a sectional view as seen in the arrowed direction VIII—VIII in FIG. 4. Portions common to the work conveying system of the first embodiment are identified by the same reference numerals as in the first embodiment.

In comparison with the linear moving mechanism provided in the horizontal moving means 12 in the work conveying system 10 of the first embodiment, a linear moving mechanism provided in a work conveying system 10 of this second embodiment or in a horizontal moving means 12 used therein is different in only the structure of an elongated gap 28 portion and that of a connecting member 22. It is optional whether cleaning means 30 are to be provided or not, but for completely solving the problem of dust in the clean room it is desirable to provide the cleaning means 30. The work conveying system 10 of this second embodiment or the horizontal moving means 12 used therein is provided with at least one linear moving mechanism. For example, there is a case where plural linear moving mechanisms are used in combination to constitute a horizontal moving means 12 which can move arbitrarily in a horizontal plane, or there is a case where only one linear moving mechanism is provided to constitute a horizontal moving means which can move on only one horizontal line. There also can be a case where only one linear moving mechanism is provided to constitute a vertical moving means which can move on only one vertical line.

In the linear moving mechanism provided in the work conveying system 10 of this second embodiment or in the horizontal moving means 12 used therein, in the portion of the elongated gap 28 in which the connecting member 22 for connecting the slider 21 to the traveling body 20 extends through the duct 17 and travels along the traveling path A, there is disposed a deformable sealing means 40 which covers the elongated gap 28 portion without obstructing the travel of the connecting member 22. The sealing means 40 also plays the role of minimizing the gap in the elongated gap 28 portion in order to enhance the dust sucking effect by the fans 31 in the cleaning means 30.

As shown in FIGS. 4, 7, and 8, the sealing means 40 corresponds to an expansion member 41 which is in a bellows shape and which extends naturally in a normal condition to permit sealing of the elongated gap 28 portion. In this second embodiment, in front of the connecting member 22 as seen in the traveling direction (indicated with arrow B) of the connecting member 22 there are provided a first seal holding member 51 for holding the expansion member 41 in an initially closed state and a first seal opening member 52 for subsequently opening the expansion member 41 when the connecting member 22 passes the elongated gap 28 portion. Further, at the rear of the connecting member 22 there are provided a second seal opening member 53 for holding the expansion member 41 in an initially opened state and a second seal holding member 54 for subsequently closing the expansion member 41 when the connecting member 22 passes the elongated gap 28 portion.

The first and second seal holding members 51, 54 and the first and second seal opening members 52, 53 are all rollers, which are supported rotatably at both ends of L-shaped roller support members 55 and 56 respectively, the roller support members 55 and 56 being fixedly mounted to both end portions of a travel assist member 50, whereby the rollers are positioned fixedly with respect to the travel assist member 50 and the connecting member 22. The travel assist member 50 is in an elongated shape of such a size as encloses the connecting member 22 in side view and is fixed in the traveling direction to a nearly central part in the longitudinal direction (the direction perpendicular to the traveling direction) of the connecting member 22. The travel assist member 50 is provided at both ends thereof with tapered portions 50a and 50b which extend outwardly downward.

The first seal holding member 51, which is located in front of the front tapered portion 50a of the travel assist member 50, presses a flat lower end portion 41a of the expansion member 41 from above to maintain a state of closed seal (see FIG. 8), while the first seal opening member 52, which is located at a rear shoulder portion of the front tapered portion 50a of the travel assist member 50, is mounted so as to be exposed upward slightly partially while being buried into a recess 50c (see FIGS. 6 and 7) formed therein. The first seal opening member 52 pushes up the flat lower-end portion 41a of the expansion member 41 from below to hold an opened state of seal (see FIG. 7). By such operations of the first seal holding member 51 and the first seal opening member 52, the travel of the connecting member 22 and that of the travel assist member 50 within the elongated gap 28 are assisted while the seal of the elongated gap 28 is ensured.

The second seal opening member 53, which is located at a front shoulder portion of the rear tapered portion 50b in the travel assist member 50, is mounted so as to be exposed upward slightly partially while being buried into a recess 50c formed therein and pushes the flat lower-end portion 41a of the expansion member 41 from below to maintain an opened state of seal (see FIG. 7). The second seal holding member 54 is located behind the rear tapered portion 50b of the travel assist member 50 and presses the flat lower-end portion 41a of the expansion member 41 from above to restore a closed state of seal (see FIG. 8). By such operations of the second seal opening member 53 and the second seal holding member 54, the travel of the connecting member 22 and that of the travel assist member 50 within the elongated gap 28 are continuously assisted and a positive seal of the elongated gap 28 is recovered.

Since this second embodiment is constructed as above, there can be obtained the following effects.

As in the first embodiment, the traveling body 20 as one constituent of the linear moving mechanism provided in the work conveying system 10 or in the horizontal moving means 12 used therein is adapted to engage the guide portion 18a located in the interior of the traveling path A covered with the duct 17 and travel through the interior space of the traveling path A, so that dust generated from the slide portion where the traveling body 20 and the guide portion 18a are engaged with each other is confined into the duct 17 and the possibility of its leaking out into the exterior clean room is decreased. Besides, since the motor 23 serving as a drive source of the traveling body 20 is integral with the traveling body 20, the drive portion (including the drive motor 23, pinion 24 and rack 25) of the traveling body 20 is also positioned in the interior of the traveling path A and dust generated from the drive portion is less likely to leak out into the clean room. In this second embodiment, moreover, the deformable sealing means 40 which covers the elongated gap 28 portion without obstructing the travel of the connecting member 22 is disposed in the elongated gap 28 portion in which the connecting member 22 for connecting the slider 21 to the traveling body 20 extends through the duct 17 and travels along the traveling path A, so that the proportion of dust leaking out into the clean room through the elongated gap 28 is greatly decreased. Consequently, it becomes possible to keep the interior of the clean room at a high degree of cleanness.

Further, the slide portion between the traveling body 20 and the guide portion 18a and the drive portion of the traveling body 20 are positioned nearly centrally, or in the vicinity thereof, in the interior of the traveling path A covered with the duct 17, that is, the slide portion and the drive portion are positioned relatively far from the elongated gap 28, and therefore the possibility that the dust generated from the slide portion and the drive portion may be discharged into the clean room through the elongated gap 28 is so much decreased. Consequently, the interior of the clean room can be kept at a still higher degree of cleanness.

The sealing means 40 is constituted as a bellows-like expansion member 41 and, when looking in the traveling direction (indicated with arrow B) of the connecting member 22, in front of the connecting member 22 are disposed the first seal holding member 51 for holding the expansion member 41 in an initially closed state and the first seal opening member 52 for subsequently opening the expansion member 41 when the connecting member 22 travels through the elongated gap 28, while at the rear of the connecting member 22 are disposed the second seal opening member 53 for maintaining the expansion member 41 in an initially opened state and the second seal holding member 54 for subsequently closing the expansion member 41 when the connecting member 22 travels through the elongated gap 28. Therefore, the travel of the connecting member 22 and that of the travel assist member 50 within the elongated gap 28 can be assisted while ensuring a positive seal of the elongated gap 28.

Further, in the case where the sealing means 40 is constituted as the expansion member 41 which is bellows-like and which extends naturally in a normal condition to seal the elongated gap 28 portion, all that is required for sealing is disposing a bellows-like expansion member in the elongated gap 28 portion which expansion member is commonly used as a sealing member or as a protective cover, whereby there can be easily obtained a deformable sealing means 40 which covers the elongated gap 28 portion without obstructing the travel of the connecting member 22.

Figure 9:
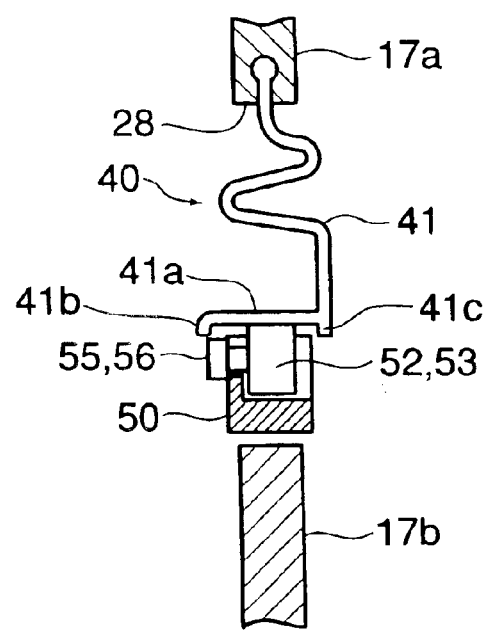
FIG. 9 is a view similar to FIG. 7, showing a modified example of a sealing means used in the work conveying system of the second embodiment.

The shape of the expansion member 41 serving as the sealing means 40 may be modified as in FIG. 9. In this modified example, projecting portions 41b and 41c having a small downward length are formed along inner and outer side edges of the flat lower-end portion 41a of the expansion member 41. With such projecting portions 41b and 41c, when the expansion member 41 has been extended to seal the elongated gap 28 portion, there is no fear of the flat lower-end portion 41a of the expansion member 41 being disengaged from the upper edge on the elongated gap 28 side of the lower duct half 17b. Also when the flat lower-end portion 41a of the expansion member 41 is pushed up from below by the first and second seal opening members (rollers) 52 and 53, the flat lower-end portion 41a is not disengaged from the upper edges of the first and second seal opening members 52, 53 and the travel assist member 50, thus ensuring a stable seal of the elongated gap 28 portion.

Next, a description will be given below of an embodiment (third embodiment) of the invention described in the foregoing ninth aspect.

In a linear moving mechanism provided in a work conveying system 10 of this third embodiment, though not shown, a sealing means 40 is constituted by an expansion member which normally extends with a magnetic force to seal the elongated gap 28. In this point the work conveying system 10 of this third embodiment is different from the previous second embodiment, but is not different in the other points, so a detailed explanation thereof will be omitted.

Since this third embodiment is constructed as above, there can be attained the following effects.

By imparting magnetism to a lower edge of a commonly-used expansion member which lower edge extends along the elongated gap 28, for example, to the flat lower-end portion 41a of the expansion member 41 in the second embodiment, and by attracting the lower edge magnetically, the expansion member 41 can be extended to cover the elongated gap 28 portion, so that the elongated gap 28 portion can be sealed positively at a portion where the connecting member 22 does not pass. Besides, there is no obstacle to a smooth travel of the connecting member 22. Further, there can be obtained the same effects as in the second embodiment.

Figure 10:
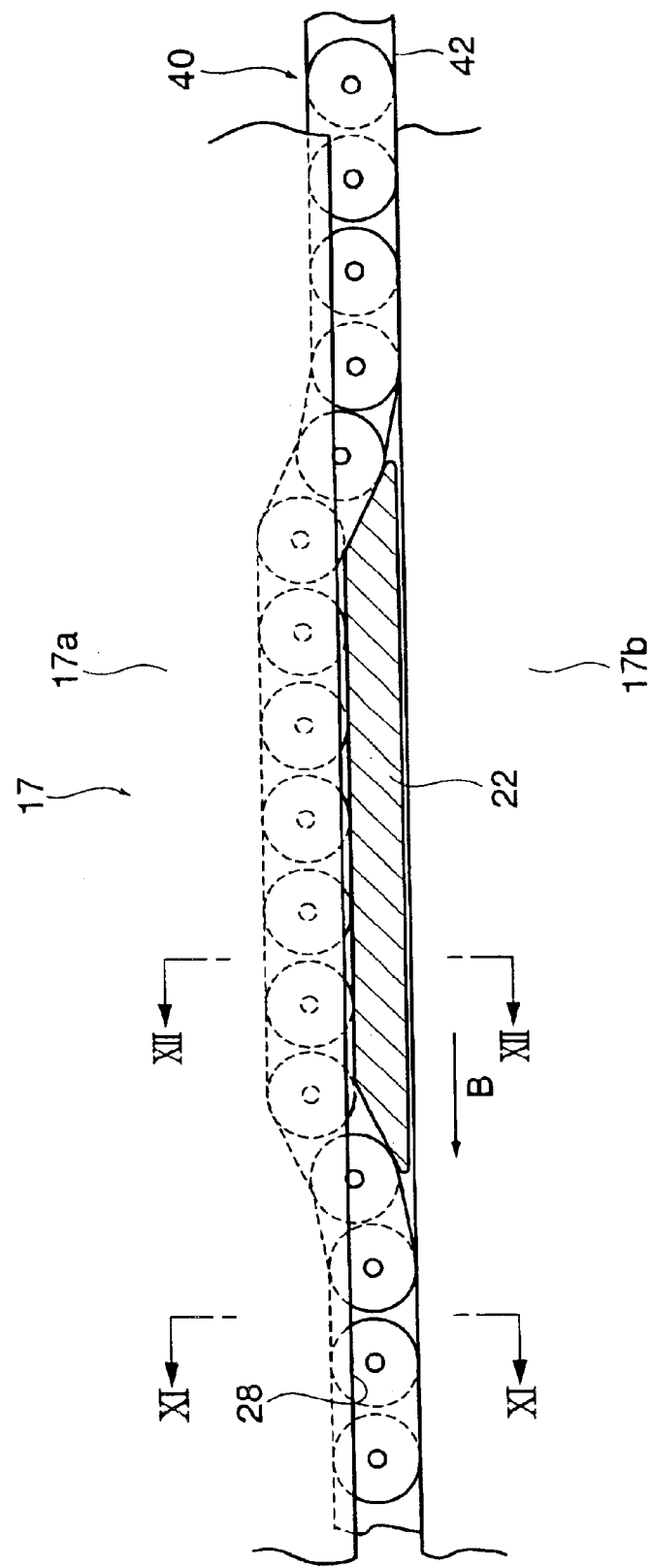
FIG. 10 is a partial sectional side view of a linear moving mechanism provided in a work conveying system according to an embodiment (fourth embodiment) of the invention described in the foregoing eleventh aspect, as cut at a position corresponding to line IV—IV in FIG. 2 and as seen in the arrowed direction.
Figure 11:
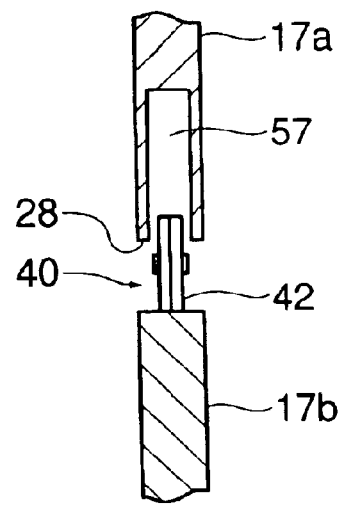
FIG. 11 is a sectional view as seen in the arrowed direction XI—XI in FIG. 10.
Figure 12:
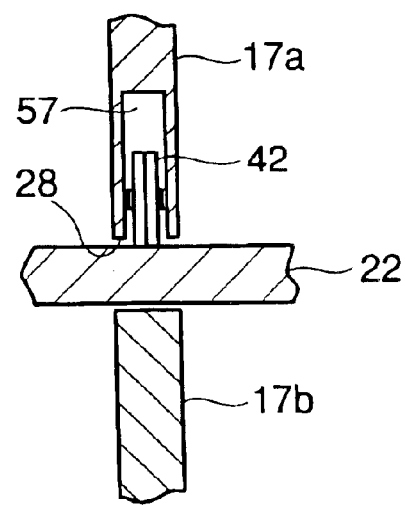
FIG. 12 is a sectional view as seen in the arrowed direction XII—XII in FIG. 10.

Next, reference will be made below to an embodiment (fourth embodiment) of the invention described in the foregoing eleventh aspect, which is illustrated in FIGS. 10 to 12.

FIG. 10 is a partial sectional side view of a linear moving mechanism provided in a work conveying system of the fourth embodiment, as cut at a position corresponding to line IV—IV in FIG. 2 and as seen in the arrowed direction, FIG. 11 is a sectional view as seen in the arrowed direction XI—XI in FIG. 10, and FIG. 12 is a sectional view as seen in the arrowed direction XII—XII in FIG. 10. Portions common to the work conveying system of the second embodiment are identified by the same reference numerals as in the second embodiment.

In a linear moving mechanism provided in a work conveying system 10 of this fourth embodiment, as shown in FIGS. 10 to 12, a sealing means 40 is constituted by a chain 42, which normally hangs down naturally to seal the elongated gap 28. The first and second seal holding members 51, 54, the first and second seal opening members 52, 53, and associated components, which are used in the second embodiment, are not used in this fourth embodiment.

In the lower edge of the upper duct half 17a of the duct 17, as shown in FIGS. 11 and 12, a groove 57 where the chain 42 can pop in and out with its vertical movement is formed throughout the overall length of the duct 17. According to this construction, when the connecting member 22 passes the elongated gap 28 portion and pushes the chain 42 upward in the passing position, the chain 42 will rise while being guided by the groove 57 and enters the groove, so that the elongated gap 28 portion can be sealed positively without obstructing a smooth travel of the connecting member 22. The work conveying system 10 of this fourth embodiment is different in the above point from the second embodiment, but there is no difference in other points, so a detailed description will be omitted.

Since this fourth embodiment is constructed as above, by merely disposing a chain as a commonly-used part in the elongated gap 28 portion there can be easily obtained a deformable sealing means 40 which covers the elongated gap 28 without obstructing the travel of the connecting member 22. Additionally, like the second embodiment, there can be obtained excellent effects based on the use of the sealing means 40.

Figure 13:
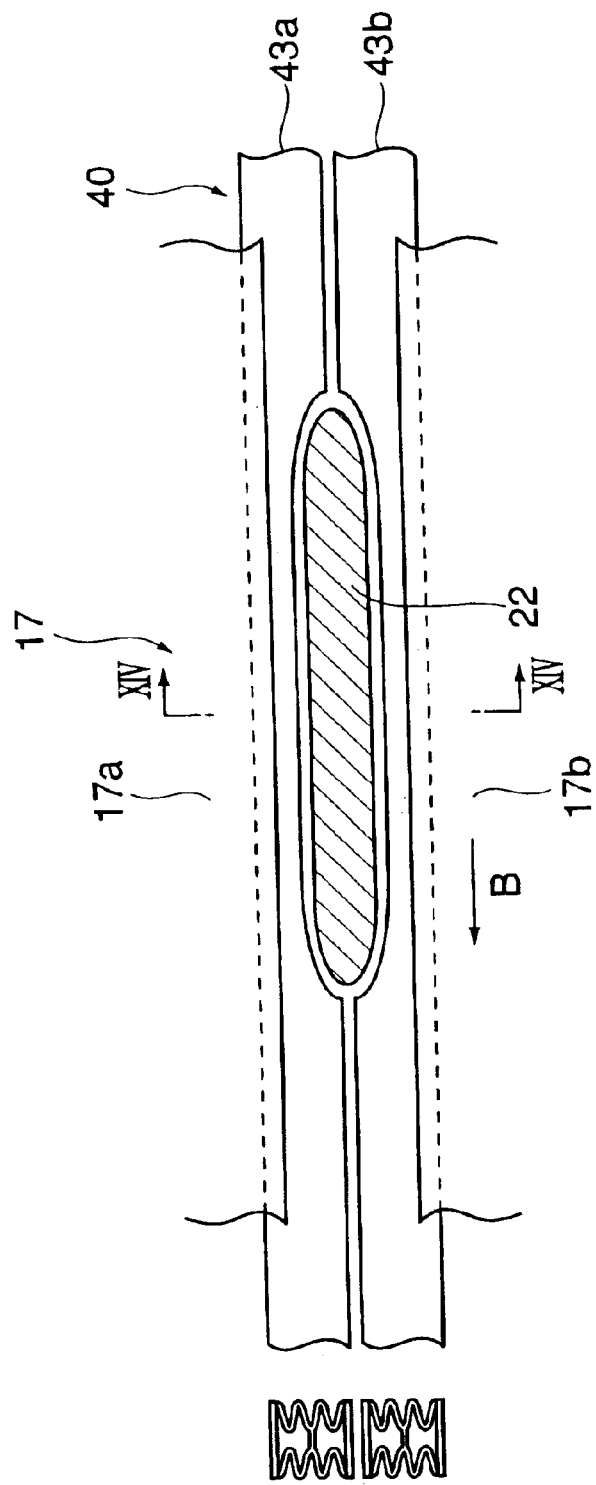
FIG. 13 is a partial sectional side view of a linear moving mechanism provided in a work conveying system according to an embodiment (fifth embodiment) of the invention described in the foregoing twelfth aspect, as cut at a position corresponding to line IV—IV in FIG. 2 and as seen in the arrowed direction.
Figure 14:
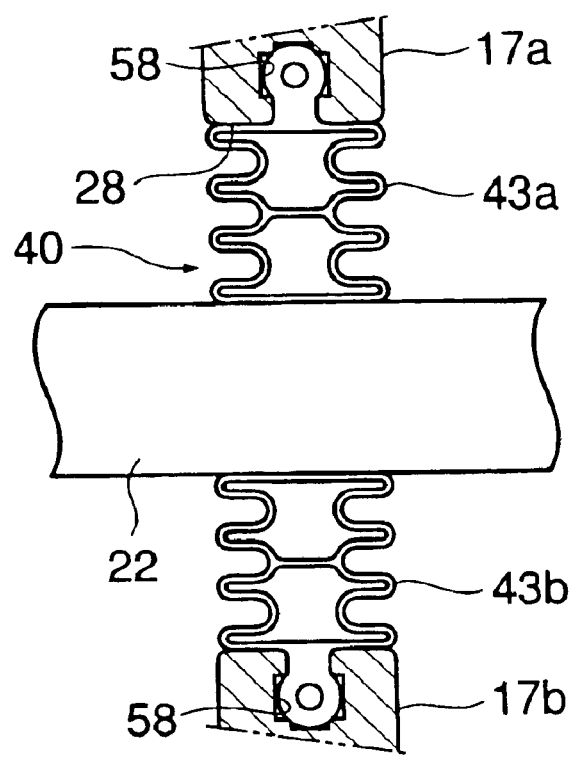
FIG. 14 is an enlarged sectional view as seen in the arrowed direction XIV—XIV in FIG. 13.

Description will now be directed to an embodiment (fifth embodiment) of the invention described in the foregoing twelfth aspect, which is illustrated in FIGS. 13 and 14.

FIG. 13 is a partial sectional side view of a linear moving mechanism provided in a work conveying system of this fifth embodiment, as cut in a position corresponding to line IV—IV in FIG. 2 and as seen in the arrowed direction, and FIG. 14 is an enlarged sectional view as seen in the arrowed direction XIV—XIV in FIG. 13. Portions common to the work conveying system of the second embodiment are identified by the same reference numerals as in the second embodiment.

In a linear moving mechanism provided in a work conveying system of this fifth embodiment, as shown in FIGS. 13 and 14, a sealing means 40 comprises a pair of upper and lower elastic tubular members 43a, 43b having a bellows-like section. The pair of upper and lower elastic tubular members 43a, 43b press the connecting member 22 constantly from above and below, and when the connecting member 22 passes the elongated gap 28 portion, it travels while pushing aside the pair of upper and lower elastic tubular members 43a, 43b upward and downward respectively (see FIG. 14), while after the connecting member 22 has passed the elongated gap 28 portion, the pair of upper and lower elastic tubular members 43a and 43b can immediately revert to their original state (see the left-hand cross sectional view in FIG. 13).

When passing the elongated gap 28 portion, the outer periphery of the connecting member 22 is pressed by the elastic tubular members 43a and 43b which have been pushed aside upward and downward respectively by the connecting member 22, so that also in this portion there is attained a satisfactory seal. In FIG. 13, a state of abutment of both end edges when the pair of upper and lower elastic tubular members 43a, 43b assume their original expanded state, as well as a pressed state of the outer periphery portion of the connecting member 22 when the tubular members 43aand 43b are in a vertically pushed and contracted state, are drawn in a rough manner to facilitate understanding.

As shown in FIG. 14, upper and lower end head portions of the pair of elastic tubular members 43a and 43b are circular in section and are inserted respectively into holes 58 formed respectively in a lower end of the upper duct half 17a of the duct 17 and an upper end of the lower duct half 17b of the duct 17(to be more specific, the elongated gap 28-side upper end of the base member 19 of the lower duct half 17b), which lower and upper ends of the upper and lower duct halves 17a and 17b define the elongated gap 28. Thus, the upper and lower end head portions of the elastic tubular members 43a and 43b are supported and fixed by the duct halves 17a and 17b. The first and second seal holding members 51, 54, the first and second seal opening members 52, 53, and associated components, which are used in the second embodiment, are not used in this fifth embodiment. The work conveying system 10 of this fifth embodiment is different in the above point from the second embodiment, but is not different in other points, so a detailed description thereof will be omitted.

Since this fifth embodiment is constructed as above, by merely disposing in the elongated gap 28 portion a pair of upper and lower elastic tubular members as commonly-used parts, e.g., elastic tubular members (tubes) 43a and 43b which on being pressed assume a balloon shape in section, there can be easily obtained a deformable sealing means 40 which covers the elongated gap 28 without obstructing the travel of the connecting member 22. In addition, as in the second embodiment, there can be obtained excellent effects based on the use of the sealing means 40.

Figure 15:
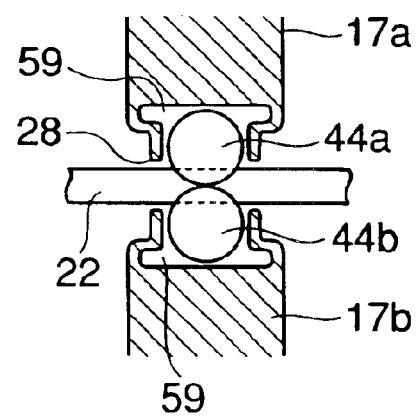
FIG. 15 is a sectional view showing a modified example of a sealing means used in the work conveying system of the fifth embodiment, in which a cut position is different from that in FIG. 14.
Figure 16:
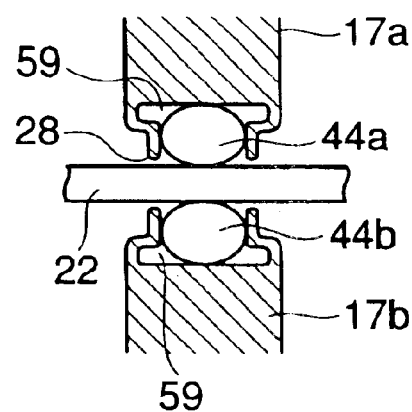
FIG. 16 is a sectional view showing the modified example, in which a cut position is the same as in FIG. 14.
Figure 17:
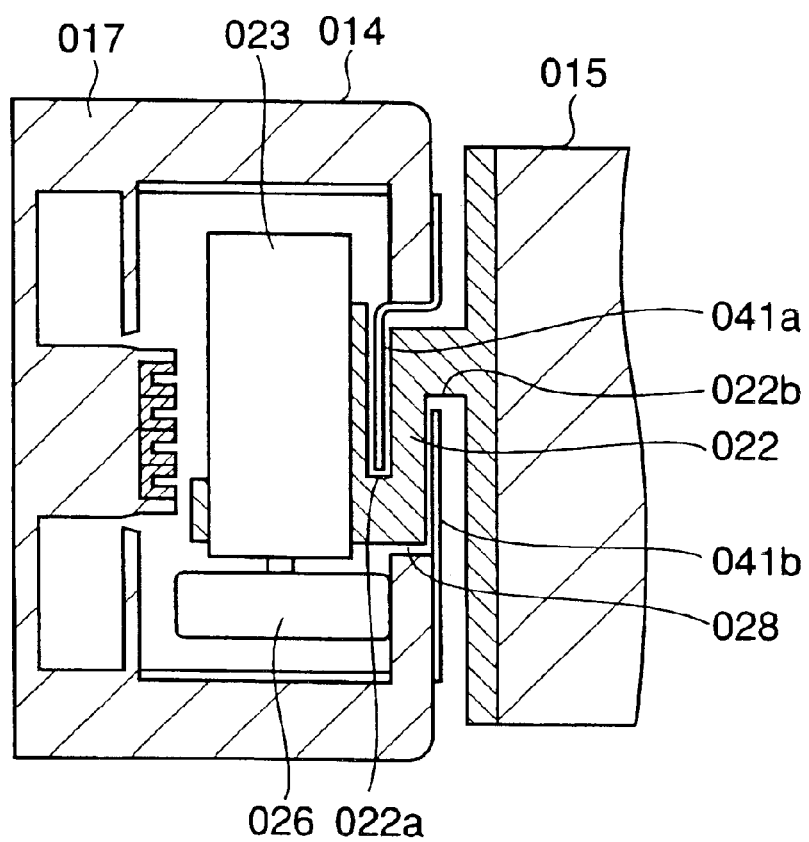
FIG. 17 is a cross sectional view of a linear moving mechanism provided in a horizontal moving means used in a conventional work conveying system.

In this fifth embodiment, the pair of upper and lower elastic tubular members 43a, 43b which constitute the sealing means 40 may be modified like a pair of upper and lower elastic tubular members 44a, 44b each having a balloon-shaped section, as shown in FIGS. 15 and 16. FIG. 15 is a sectional view of the modified example, different in cut position from FIG. 14, and FIG. 16 is a sectional view of the modified example, same in cut position as FIG. 14. In FIG. 16, the connecting member 22 passes the elongated gap 28 while pushing aside the pair of upper and lower elastic tubular members 44a, 44b upward and downward respectively, while such is not the case in FIG. 15.

Even with such a pair of upper and lower elastic tubular members 44a, 44b, there can be attained the same function and effect as that of the pair of upper and lower elastic tubular members 43a, 43b. In the duct 17 which defines the elongated gap 28, the lower end of the upper duct half 17a and the upper end of the lower duct 17b are recessed at 59 so as to receive therein and fix base ends of the pair of upper and lower elastic tubular members 44a, 44b, respectively, as shown in the figures.

The present invention is not limited to the above first to fifth embodiments, but various modifications may be made within the scope not departing from the gist of the invention.

What is claimed is:

1. A work conveying system comprising at least a work holding means for holding a work and a horizontal moving means for moving said work holding means horizontally in an upper ceiling space within a clean room, said work being conveyed to each of plural processing apparatuses while circulating among said processing apparatuses in the clean room, wherein:

said horizontal moving means has at least one linear moving mechanism, said linear moving mechanism comprising:

a traveling path covered with a duct and having a guide portion in the interior thereof;

a traveling body adapted to engage said guide portion and travel through an interior space of said traveling path; and a slider connected to said traveling body and adapted to travel together with said traveling body in the exterior of said traveling path, said work holding means or another linear moving mechanism being attached to said slider, and cleaning means are disposed at intervals in said traveling path to clean the air present within the traveling path and discharge the cleaned air to the exterior.

2. A work conveying system according to claim 1, wherein a drive source, a drive mechanism, and a power supply means, which are for said traveling body, are accommodated in the interior of said traveling path, at least said drive source being integral with said traveling body.

3. A work conveying system according to claim 1, wherein a base member serving as a base of a guide member having said guide portion constitute a part of said duct, said guide member and said base member being formed by integral molding of the same material.

4. A work conveying system according to claim 1, wherein in said horizontal moving means a plurality of said linear moving mechanisms are used in combination to permit the horizontal moving means to move arbitrarily in a horizontal plane in the upper ceiling space within said clean room.

5. A work conveying system according to claim 1, wherein said work holding means is attached to said slider through a vertical moving means for moving said work holding means vertically.

* * * * *